(12) United States Patent
Lee et al.

(10) Patent No.: US 9,036,326 B2
(45) Date of Patent: May 19, 2015

(54) GAS BEARING ELECTROSTATIC CHUCK

(75) Inventors: William David Lee, Boston, MA (US);
 Marvin Raymond LaFontaine,
 Kingston, NH (US); **Ashwin Madhukar
 Purohit, Gloucester, MA (US); Joseph
 Daniel Gillespie**, Boston, MA (US);
 Donovan Beckel, Wakefield, MA (US);
 Teng Chao Tao, Saugus, MA (US);
 Alexander Henry Slocum, Bow, NH
 (US); Samir Nayfeh, Shrewsbury, MA
 (US)

(73) Assignee: Axcelis Technologies, Inc., Beverly, MA (US)

( * ) Notice: Subject to any disclaimer, the term of this patent is extended or adjusted under 35 U.S.C. 154(b) by 2087 days.

(21) Appl. No.: 12/113,091

(22) Filed: Apr. 30, 2008

(65) Prior Publication Data
 US 2009/0273878 A1 Nov. 5, 2009

(51) Int. Cl.
 *H01L 21/683* (2006.01)
(52) U.S. Cl.
 CPC .................................. *H01L 21/6831* (2013.01)
(58) Field of Classification Search
 CPC . H02N 13/00; H01L 21/6831; H01L 21/6833
 USPC .......................................................... 361/234
 See application file for complete search history.

(56) References Cited

U.S. PATENT DOCUMENTS

| 4,948,269 | A | | 8/1990 | Hamilton |
| 5,636,098 | A | * | 6/1997 | Salfelder et al. .............. 361/234 |
| 5,754,391 | A | | 5/1998 | Bates |
| 5,822,172 | A | * | 10/1998 | White ........................... 361/234 |
| 5,838,528 | A | | 11/1998 | Os et al. |
| 5,975,536 | A | | 11/1999 | Helgeland |
| 6,108,189 | A | | 8/2000 | Weldon et al. |
| 6,433,346 | B1 | | 8/2002 | Hirayanagi |
| 6,552,892 | B2 | | 4/2003 | Carroll et al. |
| 6,570,752 | B2 | * | 5/2003 | Morita et al. ................. 361/234 |

(Continued)

OTHER PUBLICATIONS

Non-Final Office Action Dated Sep. 9, 2009 for U.S. Appl. No. 11/641,334, 16 pages.
Final Office Action dated Mar. 19, 2010 for U.S. Appl. No. 11/641,334. 18 pages.
U.S. Appl. No. 11/641,334, filed Dec. 19, 2006, Tao et al.

(Continued)

*Primary Examiner* — Thienvu Tran
*Assistant Examiner* — Ann Hoang
(74) *Attorney, Agent, or Firm* — Eschweiler & Associates, LLC

(57) ABSTRACT

An electrostatic clamp is provided having a clamping plate, wherein the clamping plate has a central region and an annulus region. A plurality of gas supply orifices are defined in the central region of the clamping plate, wherein the plurality of gas supply orifices are in fluid communication with a pressurized gas supply, and wherein the pressurized gas supply is configured to provide a cushion of gas between the clamping surface and the workpiece in the central region of the clamping plate via the plurality of gas supply orifices. One or more gas return orifices defined in one or more of the central region and annulus region of the clamping plate, wherein the one or more gas return orifices are in fluid communication with a vacuum source, therein generally defining an exhaust path for the cushion of gas. A seal is disposed in the annulus region of the clamping plate, wherein the seal is configured to generally prevent a leakage of the cushion of gas from the central region to an environment external to the annulus region. One or more electrodes are further electrically connected to a first voltage potential to provide a first clamping force.

19 Claims, 6 Drawing Sheets

(56) References Cited

U.S. PATENT DOCUMENTS

| | | |
|---|---|---|
| 6,629,423 B1 | 10/2003 | Hirooka et al. |
| 6,684,652 B2 | 2/2004 | Kim et al. |
| 7,033,443 B2 | 4/2006 | Kellerman et al. |
| 7,105,838 B2 | 9/2006 | Naylor-Smith et al. |
| 7,135,691 B2 | 11/2006 | Vanderpot et al. |
| 7,323,695 B2 | 1/2008 | Vanderpot et al. |
| 7,560,705 B2 | 7/2009 | Eiriksson et al. |
| 7,697,260 B2 | 4/2010 | Brown et al. |
| 2001/0005595 A1* | 6/2001 | Morita et al. ............ 438/22 |
| 2003/0161088 A1 | 8/2003 | Migita |
| 2003/0221626 A1 | 12/2003 | Leavitt et al. |
| 2004/0066601 A1 | 4/2004 | Larsen |
| 2005/0219786 A1 | 10/2005 | Brown et al. |
| 2006/0060259 A1* | 3/2006 | Devitt ............ 141/65 |
| 2006/0171094 A1 | 8/2006 | Muka et al. |
| 2006/0219605 A1* | 10/2006 | Devitt ............ 209/37 |
| 2007/0109714 A1 | 5/2007 | Chung |
| 2008/0105836 A1 | 5/2008 | Eiriksson et al. |
| 2008/0144251 A1 | 6/2008 | Tao et al. |
| 2009/0067114 A1* | 3/2009 | Balan ............ 361/234 |
| 2009/0273878 A1 | 11/2009 | Lee et al. |
| 2009/0277883 A1 | 11/2009 | Tandou et al. |
| 2010/0090413 A1 | 4/2010 | Mahoney et al. |
| 2010/0164303 A1 | 7/2010 | Veneruso |
| 2010/0171044 A1 | 7/2010 | Lee et al. |
| 2011/0062806 A1 | 3/2011 | Ohashi et al. |
| 2011/0291023 A1 | 12/2011 | Lee et al. |

OTHER PUBLICATIONS

"Porous Media Technology", New Way Air Bearings, Jan. 30, 2008, reprinted from the Internet at: http://www.newwayairbearings.com/porous-media-technology , 1 page.

Non-Final Office Action Dated Oct. 18, 2011 for U.S. Appl. No. 12/725,508.

Final Office Action Dated Mar. 30, 2012 for U.S. Appl. No. 12/725,508.

U.S. Appl. No. 11/840,888, filed Aug. 17, 2007. 36 Pages.

U.S. Appl. No. 12/725,508, filed Mar. 17, 2010. 28 Pages.

U.S. Appl. No. 13/116,661, filed May 26, 2011. 26 Pages.

U.S. Appl. No. 13/150,822, filed Jun. 1, 2011. 34 Pages.

Notice of Allowance dated Apr. 6, 2009 for U.S. Appl. No. 11/840,888. 6 Pages.

Office Action dated Dec. 20, 2012 for U.S. Appl. No. 13/150,822.

Final Office Action dated Jan. 7, 2013 for U.S. Appl. No. 13/116,661.

Office Action dated Mar. 25, 2013 for U.S. Appl. No. 13/116,661.

Non-Final Office Action dated Sep. 12, 2012 for U.S. Appl. No. 13/116,661.

Non-Final Office Action dated Aug. 13, 2012 for U.S. Appl. No. 13/150,822.

Notice of Allowance dated Mar. 6, 2013 for U.S. Appl. No. 13/150,822.

Notice of Allowance dated Dec. 11, 2012 issued to U.S. Appl. No. 11/641,334.

* cited by examiner

GAS BEARING ELECTROSTATIC CHUCK

FIELD OF THE INVENTION

The present invention relates generally to semiconductor processing clamping systems, and more specifically to an electrostatic clamp and method of clamping workpieces.

BACKGROUND OF THE INVENTION

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the chuck surface by electrostatic forces.

Some conventional ESCs further utilize backside gas cooling in order to cool the workpiece during processing. In such instances, a cooling gas is statically presented within a gap between the workpiece and one or more recessed surfaces of the ESC, wherein the pressure of the gas is generally proportional to the heat transfer coefficient thereof within the gap. Thus, in order to attain a higher cooling rate, a higher static backside cooling gas pressure is typically needed in order to provide the desired thermal performance. Thus, in order to maintain proper clamping of the workpiece, forces associated with the higher backside gas pressure should be properly offset with a larger clamping force or voltage applied to the ESC. In cases of high power ion implantations (e.g., 2.5 kW), the gas pressure is substantially high in order to attain proper cooling, wherein the clamping force should be appropriately increased in an attempt to compensate for the substantially high gas pressure. Further, in the case of a scanned workpiece, such as seen in some ion implantation systems, large G-forces can be present during workpiece oscillation, wherein even higher clamping forces are necessitated in order to maintain sufficient contact between the workpiece and the ESC. However, increasing the clamping force on the entire workpiece can have deleterious effects, such as increased particulate contamination, since the increased clamping pressure can cause frictional forces between the ESC and the workpiece across the surface of the workpiece, thus leading to greater chances of particulate contamination across the areas of the workpiece in which devices are formed.

Therefore, a need exists in the art for a clamp operable to constrain the workpiece, while mitigating particulate contamination, and also while providing desired temperature uniformities and clamping pressure for efficiently processing the workpiece.

SUMMARY OF THE INVENTION

The present invention overcomes the limitations of the prior art by providing a system, apparatus, and method for clamping workpieces in a semiconductor processing system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an electrostatic clamp for clamping a workpiece thereto in semiconductor processing, and method for clamping the workpiece thereto. In accordance with one exemplary aspect of the invention, the electrostatic clamp comprises a clamping plate having a clamping surface associated with the workpiece. The clamping plate, for example, has a central region and an annulus region defined therein, and wherein the annulus region is generally disposed about a periphery of the central region. The central region of the clamping plate, for example, is generally planar and void of any structure extending outwardly therefrom. One or more electrodes are further associated with the central region of the clamping plate. The one or more electrodes are further electrically connected to a first voltage potential, wherein the first voltage potential is operable to selectively attract the workpiece toward the clamping plate.

In accordance with one example, a plurality of gas supply orifices are defined in the central region of the clamping plate, wherein the plurality of gas supply orifices are in fluid communication with a pressurized gas supply. The pressurized gas supply, for example, is configured to provide a cushion of gas between the clamping surface and the workpiece in the central region of the clamping plate via a flowing of the gas through the plurality of gas supply orifices. According to one example of the invention, the central region of the clamping plate comprises a porous plate having a predetermined porosity associated therewith, wherein the plurality of gas supply orifices are generally defined by the predetermined porosity of the porous plate. The porous plate, for example, may comprise one or more of a porous carbon and a porous silicon carbide material, wherein the porosity of the porous plate generally evenly distributes the flow of gas from the central region.

One or more gas return orifices are further defined in one or more of the central region and annulus region of the clamping plate. The one or more gas return orifices, for example, are in fluid communication with a vacuum source, therein generally defining an exhaust path for the cushion of gas. The one or more gas return orifices, for example, may comprise one or more grooves in the clamping plate disposed between the central region and the seal, wherein the return or exhaust path of the cushion of gas is provided, thus generally allowing a dynamic flow of the gas within the central region.

A seal is further disposed in the annulus region of the clamping plate, wherein the seal is configured to generally prevent a leakage of the cushion of gas from the central region to an environment external to the annulus region. The seal, for example, may be an elastomeric seal extending from a first plane of the clamping plate to a second plane of the clamping plate. As an alternative, the seal may comprise one or more generally concentric differential pumping grooves defined in the clamping surface in the annulus region. Each of the one or more concentric differential pumping grooves, for example, is in fluid communication with a one or more respective vacuum sources, wherein a respective pressure associated with each vacuum source decreases for each successive differential pumping groove when moving away from the central region.

The clamping plate of the present invention may further comprise two or more pins disposed about a periphery of the annulus region, wherein the two or more notches are configured to selectively interface with a periphery of the workpiece. The two or more pins generally constrain the workpiece from lateral movement.

In accordance with yet another exemplary aspect, a method for clamping a workpiece is provided, wherein a clamping plate, such as the clamping plate described above, is provided. The method, for example, comprises placing the workpiece over the clamping plate, wherein a peripheral region of the workpiece resides over the annulus region of the clamping plate. A cushioning gas is provided via the plurality of gas supply orifices defined in the central region of the clamping plate at a first gas pressure, wherein the cushioning gas generally repels the workpiece from the clamping plate with a first repelling force. Thus, a generally frictionless interface between the workpiece and at least the central region of the clamping plate is provided.

A first voltage potential is further applied to the first electrode, therein generally attracting the workpiece to the clamping plate with a first attractive force. The first gas pressure and first voltage potential, for example, are further controlled, wherein the first repelling force and first attractive force are generally equalized. Thus, the workpiece generally "floats" on a cushion of gas, thus generally eliminating contact between the workpiece and the electrostatic clamp.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
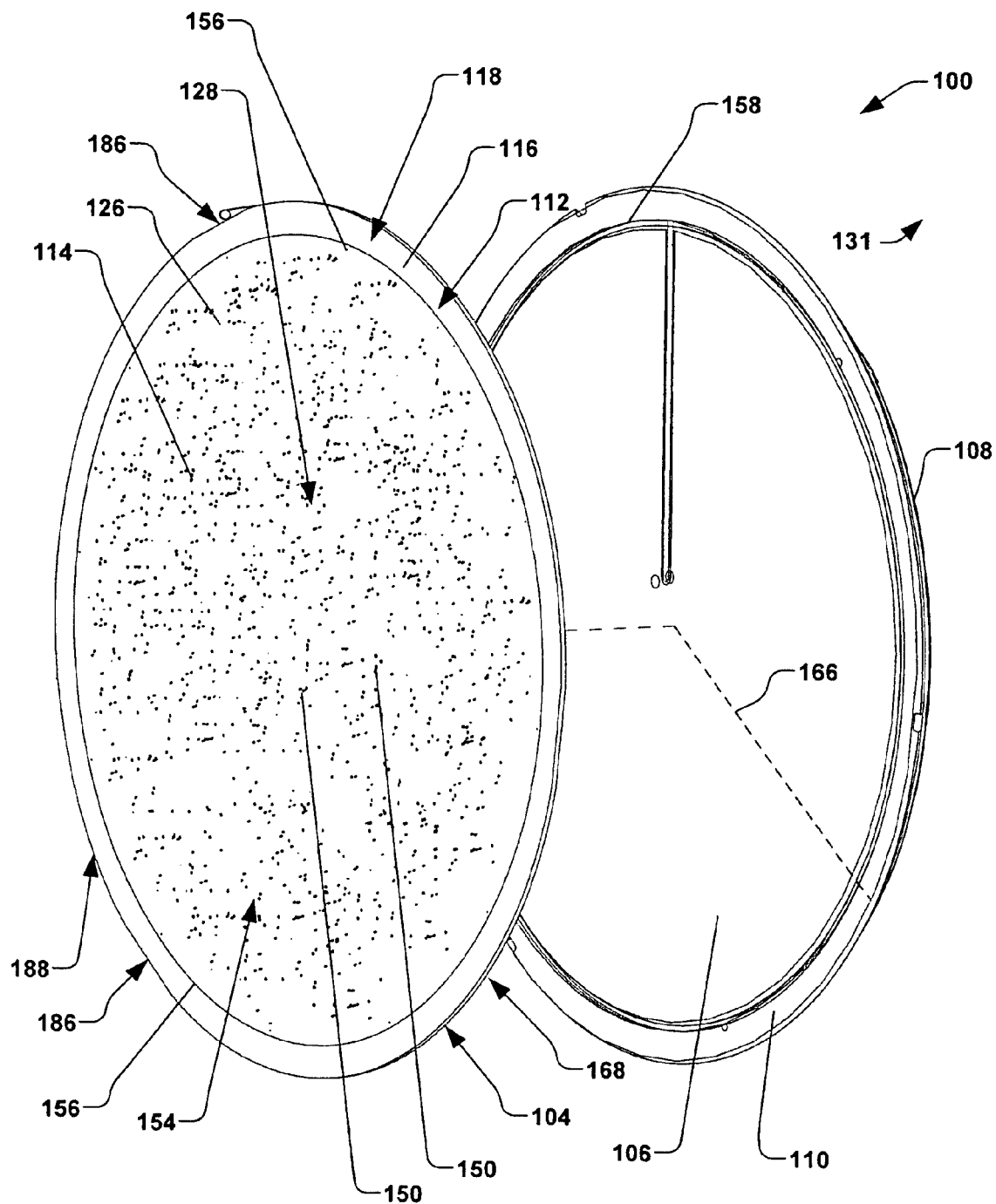
FIG. 1 illustrates an exploded perspective view on an electrostatic chuck according to one exemplary aspect of the present invention.

The present invention is directed generally toward an electrostatic clamp or chuck (ESC) that provides improved clamping and thermal uniformity, while further decreasing backside particle contamination. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates an exploded perspective view of an exemplary electrostatic clamp 100, also referred to as an "ESC". The ESC 100 is operable to substantially clamp a workpiece 102 thereto (illustrated in cross-section in FIG. 2) via electrostatic force during semiconductor processing, such as an ion implantation process, wherein the workpiece is rapidly translated in one or more directions with respect to an ion beam (not shown). The workpiece 102 may comprise a semiconductor substrate, such as a silicon wafer or other substrate. The ESC 100 shown in FIG. 1, for example, comprises a clamping plate 104, a first electrode 106, and a cooling plate 108, wherein the clamping plate, first electrode, and cooling plate are operably coupled to form the ESC. The ESC 100 may further comprise a second electrode 110 or further electrodes, and any number of electrodes are contemplated as falling within the scope of the present invention.

Figure 2:
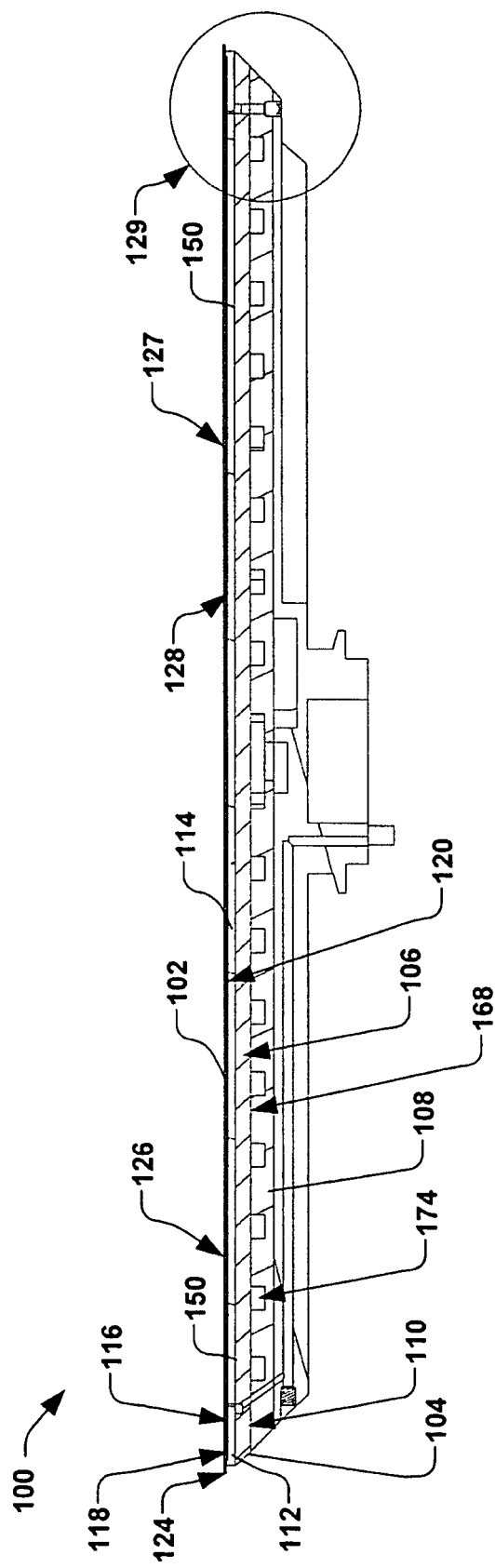
FIG. 2 illustrates a cross-sectional view of the electrostatic chuck of FIG. 1 according to another aspect of the invention.

In accordance with one aspect of the present invention, the clamping plate 104 comprises an annulus region 112 and a central region 114 defined therein, wherein the annulus region is generally disposed about a periphery 116 of the central region. The annulus region 112 comprises a first surface 118 associated therewith, wherein the first surface, in one example, is configured to generally contact the workpiece 102, illustrated in cross-section in FIG. 2. The first surface 118, for example, is operable to contact a surface 120 of the workpiece 102 about a peripheral region 122 thereof during electrostatic clamping. The peripheral region 122 of the surface 120 of the workpiece 102, for example, may be associated with an exclusionary zone 124 of the workpiece, wherein semiconductor devices are generally not formed in the exclusionary zone. The first surface 118 associated with the annulus region 112 of the clamping plate 104, for example, partially or entirely contacts the surface 120 of the workpiece 102 in the exclusionary zone 124, as illustrated in FIG. 2. A portion 129 of the exemplary ESC 100 of FIG. 2 is further shown in FIG. 3, wherein the first surface 118 is illustrated as generally contacting the workpiece 102 about the periphery 116 of the ESC. Alternatively, although not illustrated, the first surface 118 can partially or entirely contact the exclusionary zone 124 and/or an active region 126 of the surface 120 of the workpiece 102 where semiconductor devices (not shown) are formed on a frontside 127 of the workpiece 102 in the active region.

Figure 3:
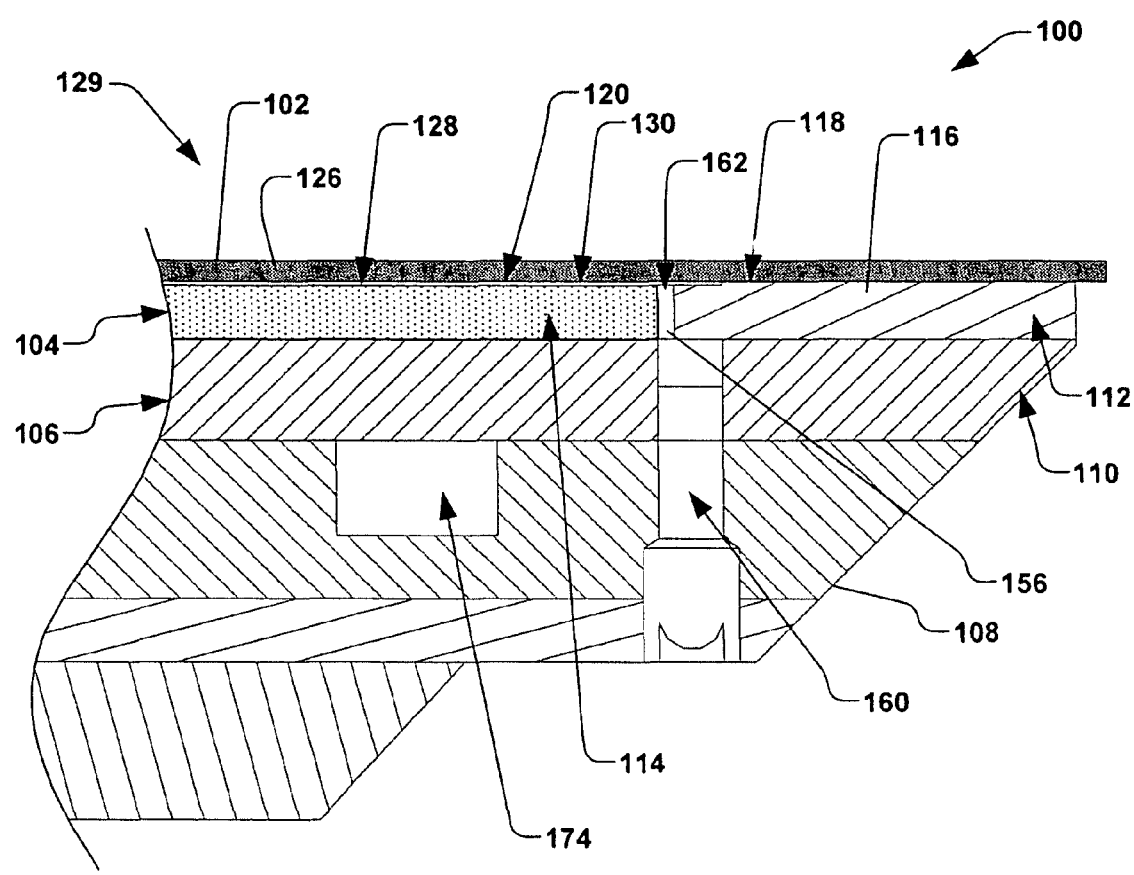
FIG. 3 is a blown-up cross-sectional view of a portion of the electrostatic chuck of FIG. 2.

In accordance with another exemplary aspect of the invention, as illustrated again in FIG. 2, the central region 114 of the clamping plate 104, comprises a second surface 128 associated with the active region 126 of the workpiece 102. As illustrated in FIG. 3 and in further detail in FIG. 4, the exemplary second surface 128 of the clamping plate 104 is generally recessed from the first surface 118 by a predetermined distance, therein generally defining a gap 130 between the second surface of the clamping plate and the surface 120 of the workpiece 102.

For example, the second surface 128 is generally recessed from the first surface 118 (e.g., a gap 130 of between approximately 0 and 30 microns). In one particular example, the second surface 128 is generally recessed from the first surface 118 of the first layer 116 by approximately 10 microns. Thus, when the workpiece 102 is placed on the ESC 100, the annulus region 112 is operable to generally isolate the central region 114 from an external environment 131 (e.g., a vacuum chamber, process chamber, or the like). In accordance with one exemplary aspect, the annulus region 112 of the clamping plate 104 is comprised of an elastomeric material (e.g., an elastomeric seal), wherein the elastomeric material generally defines the first surface 118. The elastomeric material thus provides a seal between the workpiece 102 and the clamping plate 104, wherein the central region 114 is generally isolated from the external environment 131.

Figure 4:
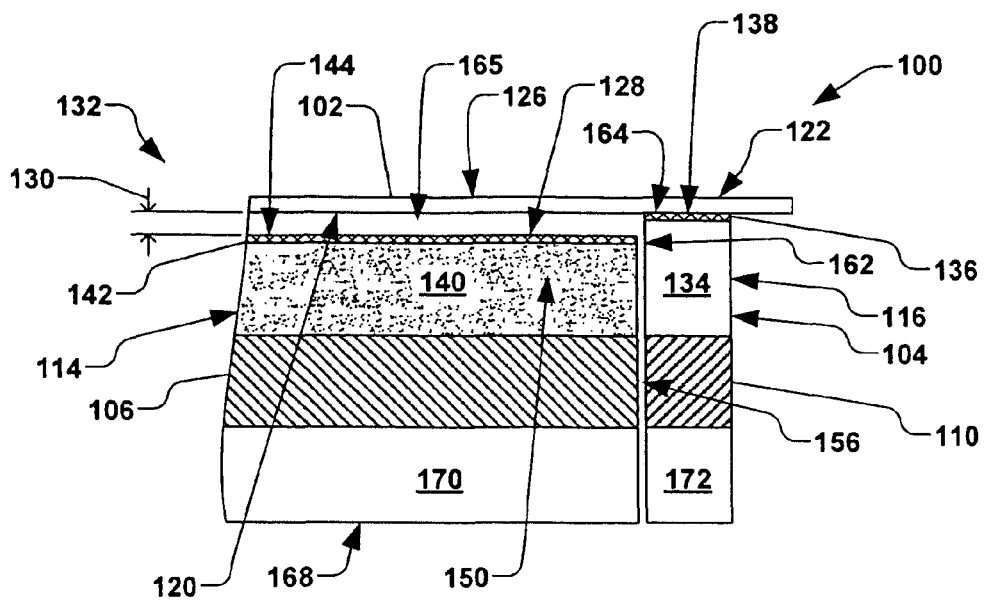
FIG. 4 is a simplified cross-sectional view an exemplary electrostatic chuck according to still another aspect of the present invention.

In yet another example, the second surface 128 is generally co-planar with the first surface 118 (e.g., a gap 130 of FIG. 4 of zero). The selection of the gap 130, for example, is further generally determined by the gas pressure associated with the second surface 128 and an electrostatic force applied to the workpiece 102, wherein an equilibrium between the gas pressure and the electrostatic force is generally desirable in order to "float" the workpiece over the clamping plate 104, as will be described infra.

According to yet another example, the present invention contemplates differential pumping at the periphery 116 of the clamping plate 104 of FIG. 1, wherein one or more azimuthally placed differential pumping grooves (not shown) in the annulus region 112 are provided, and wherein progressively higher vacuum (e.g., lower pressures) are provided to the one or more differential pumping grooves when progressing outwardly from the center of the clamping plate. For example, the first surface 118 and second surface 128 can be generally co-planar, wherein the differential pumping grooves, for example, generally extend into the clamping plate 104, thus substantially prohibiting gas flow from the ESC 100 from extending beyond the periphery 116 of the clamping plate to the external environment 131, as will be understood by the skilled artisan.

In accordance with another example, the annulus region 112 and central region 114 of the clamping plate 104 comprise a J-R type material (e.g, alumina doped with titanium, aluminum nitride doped with cerium oxide, or the like). A J-R material (e.g., a semiconductive dielectric material having a bulk resistivity between $1 \times 10^8$ to $1 \times 10^{12}$ Ohm-cm) has an advantage over non-doped materials in a J-R-type ESC 100 because the clamping plate 104 can be substantially thick (e.g., a thickness of 0.5 mm or more), and does not require subsequent thinning by machining, grinding, or other techniques in order to produce useful clamping forces. Alternatively, the annulus region 112 and central region 114 of the clamping plate 104 comprise a non-J-R material, wherein the ESC 100 can be considered anon-J-R or Coulombic-type clamp.

FIG. 4 illustrates a simplified view 132 of the portion 129 of the exemplary ESC 100 of FIG. 2, wherein several inventive aspects of the present invention are further illustrated. As illustrated in FIG. 4, in accordance with one example, the annulus region 112 of the clamping plate 104 comprises a first dielectric layer 134 having a first protective layer 136 formed thereon, wherein the first surface 118 is generally defined by a top surface 138 of the first protective layer. In one example, the first dielectric layer 134 comprises a doped dielectric material such as one or more of titania-doped alumina and cerium oxide-doped aluminum nitride. The first protective layer 136, for example, comprises a silicon dioxide ($SiO_2$) layer formed over the first dielectric layer. Alternatively, the first protective layer 136 comprises a polyimide (PI) or other polymer formed over the first dielectric layer 134.

In a similar manner, the central region 114 of the clamping plate 104, for example, comprises a second dielectric layer 140 having a second protective layer 142 formed thereon, wherein the second surface 128 is generally defined by a top surface 144 of the second protective layer. The first dielectric layer 134 and second dielectric layer 140 can be comprised of similar or differing materials. Likewise, the first protective layer 136 and second protective layer 142 can be comprised of similar or differing materials. In one example, the first dielectric layer 134 and second dielectric layer 140 are formed from a common ceramic substrate, wherein the first protective layer 136 and second protective layer 142 are formed over the first and second dielectric layers after the first and second dielectric layers are formed.

In accordance with one example, the first electrode 106 the ESC 100 illustrated in FIG. 2 is associated with the central region 114, and the second electrode 110 is associated with the annulus region 112, wherein the first electrode and second electrode are generally electrically isolated from one another. One or more of the first electrode 106 and second electrode 110, for example, are comprised of one or more of silver, gold, titanium, tungsten, or other electrically conductive metal or material. The first electrode 106 and the second electrode 110 of the ESC 100 can be respectively electrically connected to a respective first voltage source 146 (e.g., a first voltage potential) and second voltage source 148 (e.g., a second voltage potential), as illustrated in FIG. 5, and as will be discussed infra.

Figure 5:
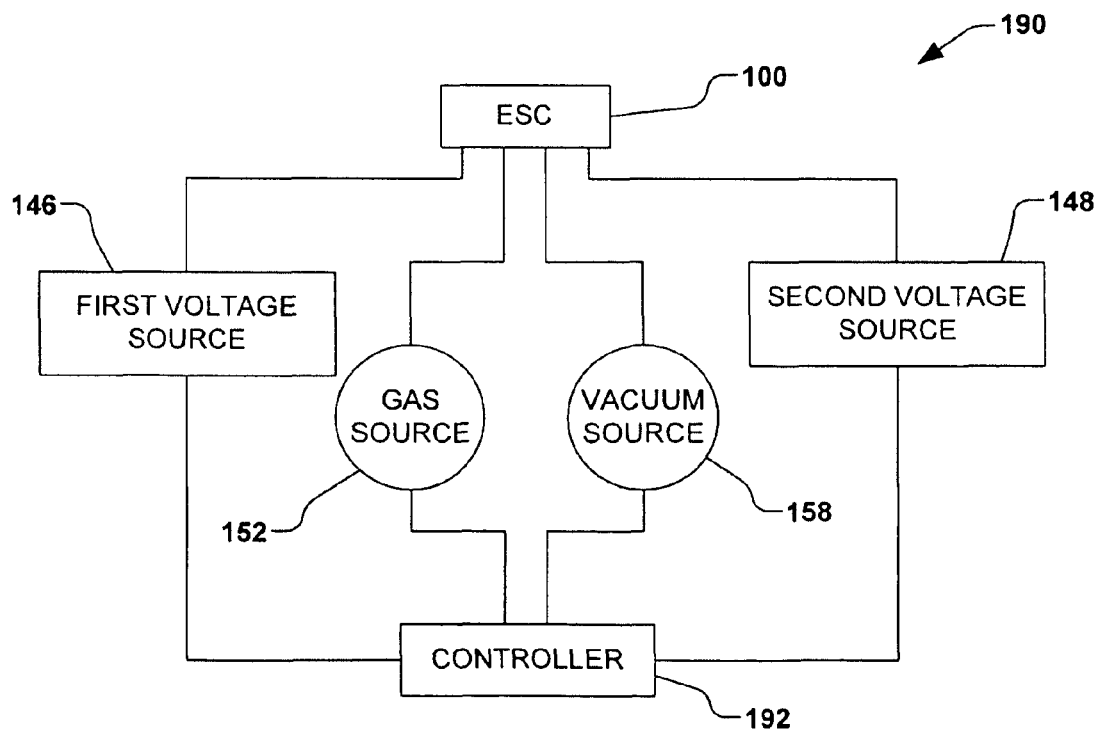
FIG. 5 is a block diagram of an exemplary system comprising the electrostatic chuck of the present invention.

In accordance with the invention, as illustrated in FIG. 1, the clamping plate 104 further comprises comprise a plurality of gas supply orifices 150 associated with the central region 114, wherein the plurality of gas supply orifices are in fluid communication with a pressurized gas source or supply 152, as again illustrated in FIG. 5. The plurality of gas supply orifices 150 of FIG. 1, for example, are configured to provide a cushion of gas (not shown) between the clamping surface (e.g., the second surface 128) and the surface 120 of the workpiece 102 in the central region of the clamping plate 104 via the gas supply 152 of FIG. 5.

The plurality of gas supply orifices 150 of FIG. 1, for example, are generally defined by a porosity of the second dielectric layer 140 central region 114 of the clamping plate 104 (as illustrated in FIG. 4). For example, at least the central region 114 of the clamping plate 104 comprises a porous plate 154 having a predetermined porosity, $\phi$, associated therewith. In the present example, the second dielectric layer 140 of FIG. 4 comprises the porous plate 154. Accordingly, the plurality of gas supply orifices 150 of FIG. 1 are generally defined by the predetermined porosity of the porous plate 154. According to one example, the porous plate 154 comprises one or more of a porous carbon and a porous silicon carbide material. The porous plate 154, in another example, comprises a porous graphite material. In accordance with another example, the predetermined porosity $\phi$ of the porous plate 154 is generally given as a ratio of volume of voids ($V_V$) to a volume of bulk material ($V_B$), where $$\phi = V_V/V_B \qquad (1).$$

The predetermined porosity $\phi$ can have a range from zero to one, or 0% to 100% porosity. In one particular example, the predetermined porosity $\phi$ of the porous plate 154 is selected to be within the range of approximately 5% to approximately 75%. As structural integrity and a capacity to flow gas through the porous plate 154 is generally dependent on material selection and the predetermined porosity associated therewith, the present invention contemplates the porous plate being comprised of any material and predetermined porosity $\phi$ capable of providing sufficient flow and support/clamping of the workpiece 102 as falling within the scope of the present invention. Further, it should be noted that at least the second protective layer 142 of FIG. 4, for example, may further comprise a porous material formed over the second dielectric layer 140. It should be noted that the plurality of gas supply orifices 150 may be uniformly distributed about the central region 114 of the clamping plate 104. For example, the plurality of gas supply orifices 150 may comprise a plurality of machined or otherwise formed bores, slits, rings, grooves, or other orifices (not shown) in the central region 114 of the clamping plate 104, wherein the plurality of gas supply orifices are in fluid communication with the gas supply 152 of FIG. 5. An architecture or patterning of the plurality of gas supply orifices 150 can therefore be determined based on an optimal flow of cushioning gas from the gas supply 152.

In accordance with yet another aspect, one or more gas return orifices 156 are defined in one or more of the central region 114 and annulus region 112 of the clamping plate 104. The one or more gas return orifices 156, for example, are in fluid communication with a vacuum source 158, as illustrated in FIG. 5. The one or more gas return orifices 156 of FIGS. 3 and 4, for example, may comprise one or more grooves and holes 160 disposed about an interface 162 between the annulus region 112 and the central region 114, as illustrated in FIGS. 3 and 4, thus providing an exhaust path for the cushioning gas (not shown) through the ESC 100.

The annulus region 112, for example, is further operable to provide a substantial seal 164 between the peripheral region 122 of the surface 120 of the workpiece 102 and the ESC 100, wherein the cushioning gas is generally maintained within a volume 165 defined by the annulus region, the central region 114, and the workpiece. By controlling a pressure and flow of the cushioning gas from the plurality of gas supply orifices 150 and back through the one or more gas return orifices 156 (e.g., via the gas source 152 and vacuum source 158 of FIG. 5), the clamping plate 104 is operable to provide a first force to generally repel the workpiece 102 from the ESC 100. The pressure and flow of cushioning gas from the plurality of gas supply orifices 150 can thus generally counteract electrostatic forces associated with the voltage potentials applied to the first electrode 106 and the second electrode 110 via the first voltage source 146 and second voltage source 148 of FIG. 5. Such a counteraction or balancing of forces is thus operable to provide a generally frictionless interface between the workpiece 102 and at least the central region 114 of the clamping plate 104. Further, by controlling a pressure and flow of the cushioning gas from the plurality of gas supply orifices 150 and through the one or more gas return orifices 156 (e.g., via the gas source 152 and vacuum source 158 of FIG. 5), a transfer of heat between the workpiece 102 and the ESC 100 can also be controlled, depending on the flow and temperature of the cushioning gas.

In one example, the one or more gas return orifices 156 have a diameter of approximately 2 millimeters or less, however, various other sized holes are also contemplated as falling within the scope of the present invention. For example, the one or more gas return orifices 156 can have a diameter of approximately 500 microns. The size of the gas return orifices can be varied based on pressure(s) and flow rate(s), and thus can be optimized for any given application of the ESC 100.

In one alternative, the one or more gas return orifices 156 of FIG. 1 comprise one or more slits (not shown), wherein the one or more slits generally extend a predetermined distance (not shown) along the interface 162 between the annulus region 112 and the central region 114. For example, the one or more slits may comprise linear or arcuate slits, wherein a radial width of the one or more arcuate slits, as measured as extending along a radius 166 of the ESC 100, can be approximately 2 millimeters or less when measured between the annulus region 112 and the central region 114. A length of the one or more elongate slits, for example, can be substantially larger than the radial width thereof.

In accordance with yet another exemplary aspect of the invention, the cooling plate 108 of the ESC 100 of FIGS. 1-4 is associated with a backside 168 of the clamping plate 104, as illustrated in FIG. 4, wherein the clamping plate 104 further comprises a first insulating layer 170 formed between the first electrode 106 and the cooling plate 108 of FIG. 1, and a second insulating layer 172 formed between the second electrode 110 and the cooling plate. One or more of the first insulating layer 170 and second insulating layer 172, for example, is comprised of a dielectric material, wherein the dielectric material can comprise of one or more of alumina, aluminum nitride, or other insulating material.

Figure 6:
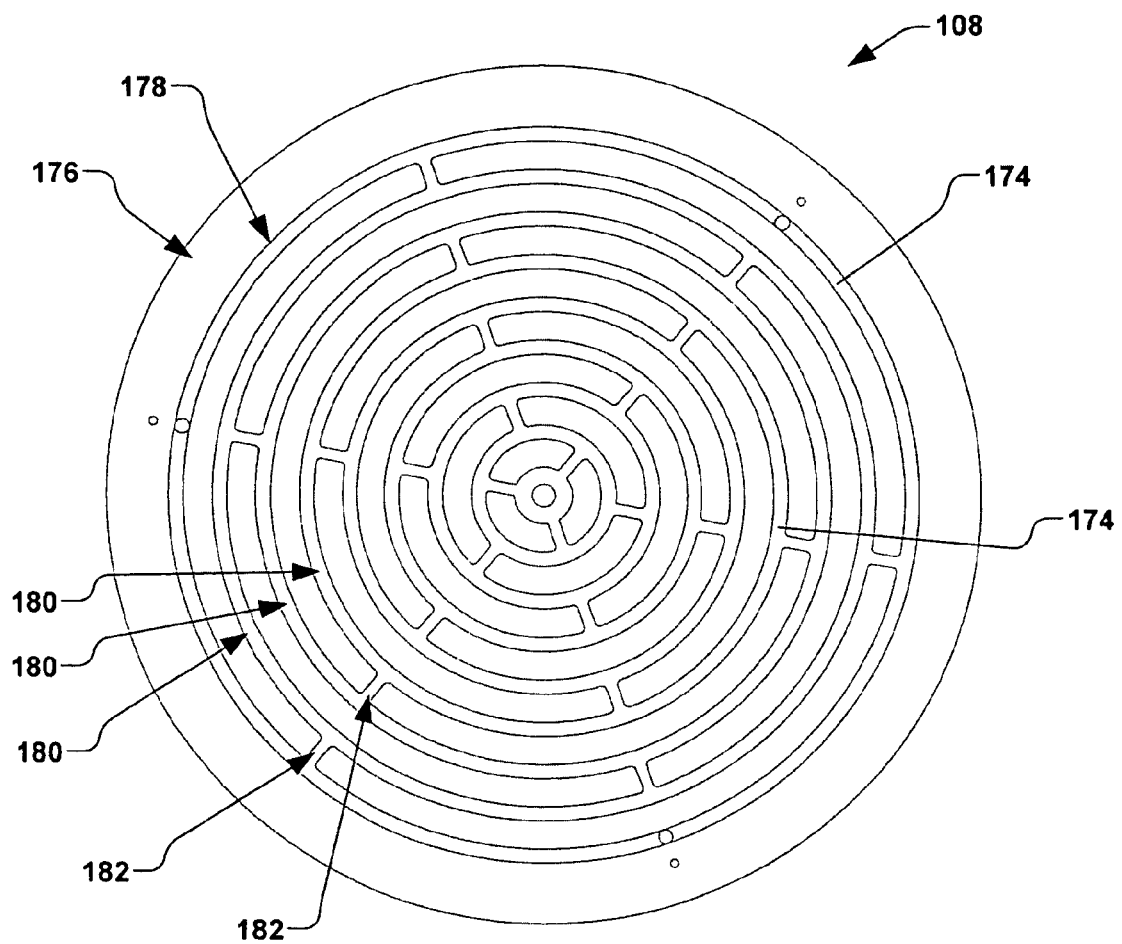
FIG. 6 illustrates a top plan view of an exemplary cooling plate according to yet another aspect of the present invention.

The cooling plate 108, in accordance with another exemplary aspect of the present invention illustrated in FIG. 6, comprises one or more cooling channels 174. The one or more cooling channels 174, for example, are configured to route a cooling fluid (not shown) such as water, between the clamping plate 104 and the cooling plate 108 and/or through the cooling plate for cooling of the ESC 100 during semiconductor processing. FIG. 6 illustrates an exemplary front surface 176 of the cooling plate 108, wherein the front surface of the cooling plate generally interfaces with the backside 168 of the clamping plate 104 of FIG. 4, for example, wherein a predetermined pattern 178 of at least part of the cooling channels 174 is illustrated. It should be noted that the predetermined pattern 178 can differ from that illustrated in the figures, and all such patterns are contemplated as falling within the scope of the present invention.

As illustrated in FIG. 6, the one or more cooling channels 174 associated with the front surface 176 of the cooling plate 108 comprise a plurality of generally concentric channels 180 that are generally interconnected via a plurality of radial passages 182. The exemplary plurality of concentric channels 180, radial passages 182, for example, generally provide an advantageous flow of cooling fluid therethrough, wherein air bubbles are generally minimized.

Thus, the exemplary ESC 100 of FIGS. 1-4 of the present invention thus provides clamping and cooling of the workpiece 102, wherein an equilibrium of forces may be obtained between electrostatic forces associated with the central region 114 and gas pressure associated with the flow of gas in the volume 165 between the workpiece and the central region. In accordance with another exemplary aspect of the invention, the central region 114 is substantially planar, as illustrated in FIG. 1, wherein the central region is generally void of any structure extending toward (and/or contacting) the surface 120 of the workpiece 102. Alternatively, the central region 114 can comprise one or more mesas or dots (not shown) dispersed across the second surface 128, wherein the workpiece 102 of FIG. 2, for example, is generally guarded from "landing" or contacting the majority of the second surface. For example, the one or more mesas or dots can be defined by one or more of the second dielectric layer 140 and second protective layer 142.

In accordance with still another exemplary aspect of the invention, the clamping plate 104 further comprises a plurality of pins, stops, or other features 186 disposed about a periphery 188 thereof, wherein the plurality of pins are configured to interface with the peripheral region 122 of the workpiece 102 during handling and/or processing of the workpiece. For example, three or more pins 186 extend generally perpendicularly to the first surface 118 about the periphery 188 of the clamping plate 104, wherein the pins generally prevent lateral motion of the workpiece 102 during a scanning of the workpiece. The pins 186, for example, are selectably positioned to maintain the position of the workpiece 102 when the cushioning gas is supplied.

FIG. 5 illustrates an exemplary electrostatic clamping system 190, wherein the ESC 100 is operably coupled to the first voltage source 146 (e.g., a first power supply), second voltage source 148, cushioning gas source 152, return gas or vacuum source 158, and a controller 192. For example, the controller 192 is operable to control the first voltage potential 146 applied to the central region 114 of FIG. 4, in order to generally attract the workpiece 102 to the ESC 100 and to seal the backside gas within the volume 165 defined between the central region 114, annulus region 112 (e.g., the seal), and workpiece 102, while further controlling the gas source 152 and vacuum source 158 in order to provide a substantial equilibrium of forces between the electrostatic clamping and the pressure of the cushioning gas within the volume. It should again be noted that while a second voltage source 148 is provided in the present example for powering the second electrode 110, such second voltage source can be omitted if the second electrode is also omitted. Likewise, additional voltage sources (not shown) can be controlled for additional electrodes (not shown), as will be understood by one of ordinary skill in the art.

Figure 7:
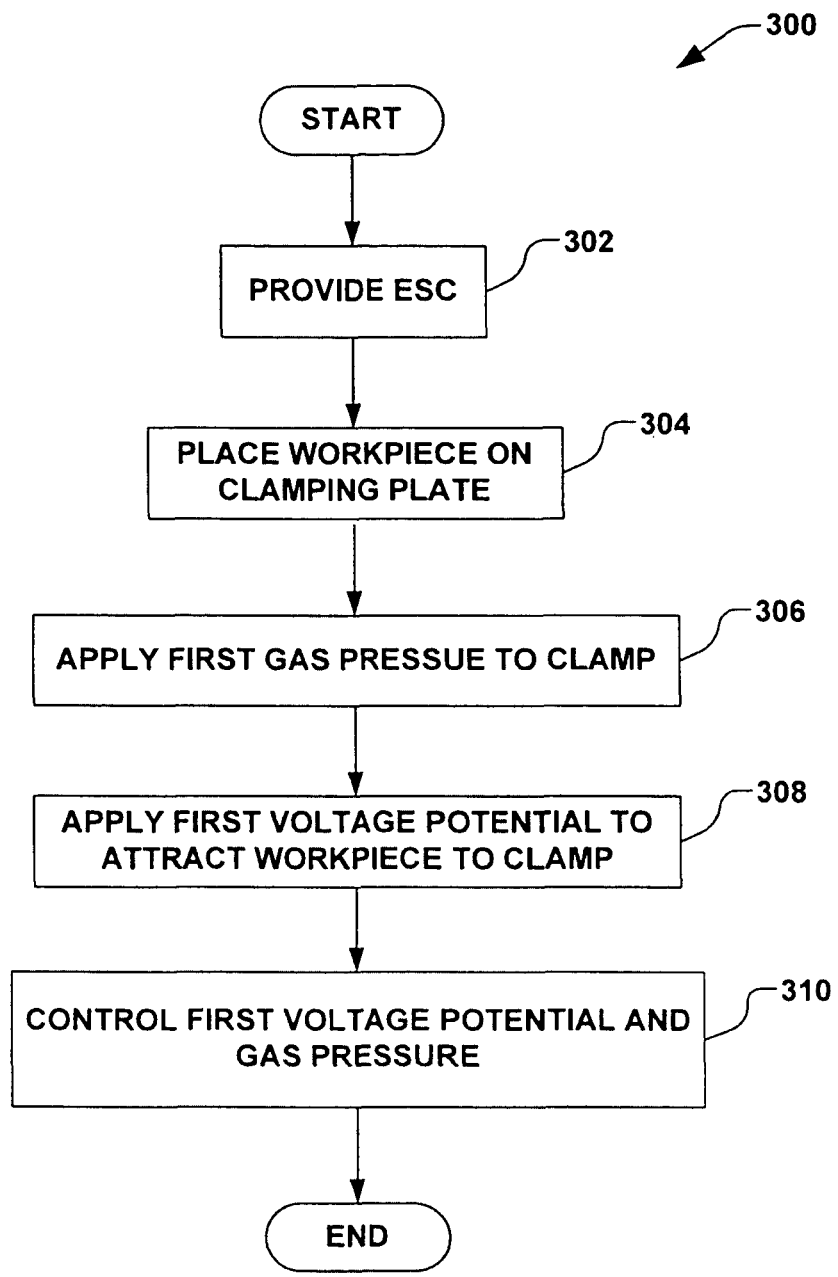
FIG. 7 is a block diagram illustrating an exemplary method for clamping a workpiece in accordance with the present invention.

In accordance with another aspect of the present invention, FIG. 7 illustrates an exemplary method 300 for clamping a workpiece via an electrostatic chuck. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 7, the method 300 begins with act 302, wherein an electrostatic chuck, such as the ESC 100 of FIGS. 1-4 is provided. The ESC that is provided in act 302, for example, comprises a clamping plate, wherein the clamping plate comprises a central region and an annulus region defined therein, and wherein a first electrode is associated with at least the central region. The clamping plate further comprises a plurality of gas supply orifices associated with the central region, and one or more gas return orifices.

In act 304, a workpiece is placed over the clamping plate, wherein, in one example, a peripheral region of the workpiece contacts the annulus region of the clamping plate. A cushioning gas is provided via the a cushioning gas supply through the plurality of gas supply orifices at a first gas pressure in act 306, wherein the cushioning gas generally repels the workpiece from the clamping plate with a first repelling force. The cushioning gas pressure generally determines an amount of force and heat transfer between the workpiece and the clamping plate. In act 308, a first voltage potential is applied to the first electrode, therein generally attracting the workpiece to the clamping plate with a first attractive force (e.g., a first clamping force).

In act 310, the first voltage potential and the cushioning gas pressure are controlled, wherein the first voltage potential generally attracts the workpiece to the clamping plate with the first force, and cushioning gas pressure generally provides an opposing or repelling force. In one example, the first attractive force and the first repelling force are equalized by the control of act 310, therein providing a generally frictionless interface between the workpiece and at least the central region of the clamping plate.

The first attractive force associated with the first voltage potential applied to the first electrode in act 306, in one example, is sufficient to generally maintain a position of the workpiece with respect to the clamping plate, and to provide a substantial seal between the workpiece and the annulus region to prevent leakage of the cushioning gas to an external environment. In another example, the differential pumping grooves provide the seal between the workpiece and the clamping plate to prevent leakage of the cushioning gas to the external environment.

Accordingly, the present invention provides an electrostatic chuck that provides improved thermal uniformities while further decreasing particulate contamination. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic clamp for selectively maintaining a position of a workpiece, the electrostatic clamp comprising:
   a clamping plate having a clamping surface associated with the workpiece, wherein the clamping plate has a central region and an annulus region defined therein, and wherein the annulus region is generally disposed about a periphery of the central region;
   a plurality of gas supply orifices defined in the central region of the clamping plate, wherein the plurality of gas supply orifices are in fluid communication with a pressurized gas supply, and wherein the pressurized gas supply is configured to provide a cushion of gas between the clamping surface and the workpiece in the central region of the clamping plate via the plurality of gas supply orifices;
   one or more gas return orifices defined in one or more of the central region and annulus region of the clamping plate, wherein the one or more gas return orifices are in fluid communication with a vacuum source, therein generally defining an exhaust path for the cushion of gas;
   a seal disposed in the annulus region of the clamping plate, wherein the seal is configured to generally prevent a leakage of the cushion of gas from the central region to an environment external to the annulus region, and wherein the seal comprises one or more concentric differential pumping grooves defined in the clamping surface in the annulus region, wherein each of the one or more concentric differential pumping grooves are in fluid communication with one or more respective vacuum sources; and one or more electrodes associated with at least the central region, wherein the one or more electrodes are electrically connected to a first voltage potential.

2. The electrostatic clamp of claim 1, wherein the central region of the clamping plate comprises a porous plate having a predetermined porosity associated therewith, wherein the predetermined porosity is defined by a ratio of a volume of voids to a volume of bulk material of the porous plate, and wherein the plurality of gas supply orifices are generally defined by the predetermined porosity of the porous plate.

3. The electrostatic clamp of claim 2, wherein the porous plate comprises one or more of a porous carbon and a porous silicon carbide material.

4. The electrostatic clamp of claim 3, wherein the porous plate comprises porous graphite.

5. The electrostatic clamp of claim 2, wherein the predetermined porosity of the porous plate ranges between approximately 5% and approximately 75%.

6. The electrostatic clamp of claim 1, wherein the plurality of gas supply orifices are distributed about the central region of the clamping plate in a generally uniform manner.

7. The electrostatic clamp of claim 1, wherein the plurality of gas supply orifices comprise one or more of a plurality of slits and a plurality of recessed rings defined in the central region of the clamping plate.

8. The electrostatic clamp of claim 1, wherein the wherein the plurality of gas supply orifices comprise a plurality of holes defined in the central region of the clamping plate.

9. The electrostatic clamp of claim 1, wherein the central region of the clamping plate is generally planar and void of any structure extending outwardly therefrom.

10. The electrostatic clamp of claim 1, wherein the clamping surface has a first plane associated with the annulus region, and a second plane associated with the central region, wherein the second plane is recessed from the first plane.

11. The electrostatic clamp of claim 10, wherein the seal comprises an elastomeric seal extending from the second plane to the first plane.

12. The electrostatic clamp of claim 10, wherein the second plane is recessed from the first plane by approximately 10 microns.

13. The electrostatic clamp of claim 1, comprising three concentric differential pumping grooves in fluid communication with three respective vacuum sources.

14. The electrostatic clamp of claim 1, wherein the one or more electrodes are further associated with the annulus region, wherein the one or more electrodes are electrically connected to a second voltage potential.

15. The electrostatic clamp of claim 1, wherein the one or more gas return orifices comprise one or more grooves in the clamping plate disposed between the central region and the seal.

16. The electrostatic clamp of claim 1, wherein the clamping plate further comprises two or more pins disposed about a periphery of the annulus region, wherein the two or more pins are configured to selectively interface with a periphery of the workpiece.

17. An electrostatic clamp for selectively maintaining a position of a workpiece, the electrostatic clamp comprising:
a clamping plate having a clamping surface associated with the workpiece, wherein the clamping plate has a central region and an annulus region defined therein, and wherein the annulus region is generally disposed about a periphery of the central region, and wherein the central region of the clamping plate comprises a porous plate having a predetermined porosity associated therewith, wherein the predetermined porosity is defined by a ratio of a volume of voids to a volume of bulk material of the porous plate and generally defines a plurality of gas supply orifices in the central region of the clamping plate, wherein the plurality of gas supply orifices are in fluid communication with a pressurized gas supply, and wherein the pressurized gas supply is configured to provide a cushion of gas between the clamping surface and the workpiece in the central region of the clamping plate via the plurality of gas supply orifices;
one or more gas return orifices defined in one or more of the central region and annulus region of the clamping plate, wherein the one or more gas return orifices are in fluid communication with a vacuum source, therein generally defining an exhaust path for the cushion of gas;
a seal disposed in the annulus region of the clamping plate, wherein the seal is configured to generally prevent a leakage of the cushion of gas from the central region to an environment external to the annulus region, and wherein the seal comprises one or more concentric differential pumping grooves defined in the clamping surface in the annulus region, wherein each of the one or more concentric differential pumping grooves are in fluid communication with one or more respective vacuum sources; and
one or more electrodes associated with at least the central region, wherein the one or more electrodes are electrically connected to a first voltage potential.

18. A method for clamping a workpiece, the method comprising:
providing a clamping plate, wherein the clamping plate comprises a central region and an annulus region having a seal defined therein, wherein a first electrode is associated with only the central region, and wherein the seal comprises one or more concentric differential pumping grooves is disposed in the annulus region of the clamping plate;
placing the workpiece over the clamping plate, wherein a peripheral region of the workpiece resides over the annulus region of the clamping plate;
providing a cushioning gas via a plurality of gas supply orifices defined in the central region of the clamping plate at a first gas pressure, wherein the cushioning gas generally repels the workpiece from the clamping plate with a first repelling force and provides a generally frictionless interface between the workpiece and at least the central region of the clamping plate;
applying a vacuum to each of the one or more concentric differential pumping grooves, therein generally preventing a leakage of the cushion of gas from the central region to an environment external to the annulus region;
applying a first voltage potential to the first electrode, therein generally attracting the workpiece to the clamping plate with a first attractive force, and wherein the workpiece is electrostatically attracted to the clamping plate only by the first attractive force; and
controlling the first gas pressure and first voltage potential, wherein the first repelling force and first attractive force are generally equalized.

19. The method of claim 18, wherein applying the first voltage potential to the first electrode generally provides a seal between the annulus region and the workpiece.

* * * * *